(12) United States Patent
Shan (10) Patent No.: US 11,477,896 B2
(45) Date of Patent: Oct. 18, 2022

(54) CONNECTING STRUCTURE AND DISPLAY DEVICE

(71) Applicant: HKC CORPORATION LIMITED, Shenzhen (CN)

(72) Inventor: Jianfeng Shan, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 282 days.

(21) Appl. No.: 16/845,020

(22) Filed: Apr. 9, 2020

(65) Prior Publication Data

US 2020/0233456 A1 Jul. 23, 2020

Related U.S. Application Data

(63) Continuation of application No. PCT/CN2017/117328, filed on Dec. 20, 2017.

(30) Foreign Application Priority Data

Oct. 12, 2017 (CN) .......................... 201710948083.0

(51) Int. Cl.
*G06F 1/16* (2006.01)
*F16M 11/04* (2006.01)
(Continued)

(52) U.S. Cl.
CPC ......... *H05K 5/0217* (2013.01); *F16B 5/0642* (2013.01); *F16M 11/04* (2013.01);
(Continued)

(58) Field of Classification Search
CPC .. F16B 5/0642; F16B 21/086; F16B 13/0808; Y10T 403/335
See application file for complete search history.

(56) References Cited

U.S. PATENT DOCUMENTS 2,758,498 A * 8/1956 Johnson ................ F16B 21/086
24/453
6,709,212 B1 * 3/2004 Lauchner ............ F16B 13/0808
411/551
(Continued)

FOREIGN PATENT DOCUMENTS

CN 1624533 A 6/2005
CN 2750626 Y 1/2006
(Continued)

OTHER PUBLICATIONS

First Office Action in counterpart Chinese Patent Application 201710948083.0, dated May 7, 2019.
(Continued)

*Primary Examiner* — Robert Sandy
*Assistant Examiner* — Rowland Do
(74) *Attorney, Agent, or Firm* — Westbridge IP LLC (57) ABSTRACT

The present disclosure provides a connecting structure and a display device, the connecting structure includes a base, a connecting rod, an elastic arm, and a clamping ring. The connecting rod includes two ends, the connecting rod defines a guiding groove between the two ends; the base is fixedly connected to one end of the connecting rod; the connecting rod defines a guiding groove between the two ends, the elastic arm is fixedly connected to the other end of the connecting rod; the clamping ring is sleeved on the elastic arm; the clamping ring defines a clamping component, the clamping component is received in the guiding groove, the clamping component moves in the guiding groove under an action of an external force, allowing the clamping ring to reciprocate along a direction of the guiding groove; the clamping ring is capable of moving to generate a force on the elastic arm.

19 Claims, 4 Drawing Sheets

(51) Int. Cl.
*G02F 1/1333* (2006.01)
*H05K 5/02* (2006.01)
*H05K 5/00* (2006.01)
*F16B 5/06* (2006.01)

(52) U.S. Cl.
CPC ...... *G02F 1/133308* (2013.01); *G06F 1/1607* (2013.01); *H05K 5/0017* (2013.01); *F16M 2200/02* (2013.01); *G06F 2200/1612* (2013.01)

(56) References Cited

U.S. PATENT DOCUMENTS

| | | | |
|---|---|---|---|
| 8,164,913 B2 | 4/2012 | Hsieh et al. | |
| 9,145,909 B2* | 9/2015 | Lepper | F16B 21/082 |
| 10,253,794 B2* | 4/2019 | Serrada Iranzo | F16B 5/0628 |
| 10,746,218 B2* | 8/2020 | Huet | F16B 21/086 |
| 11,044,824 B2* | 6/2021 | Shan | H01R 13/502 |
| 2011/0014005 A1* | 1/2011 | Shinozaki | F16B 21/086 |
| | | | 411/347 |
| 2019/0056093 A1* | 2/2019 | Boyer | F21V 21/116 |

FOREIGN PATENT DOCUMENTS

| | | |
|---|---|---|
| CN | 1841447 A | 10/2006 |
| CN | 100371779 C | 2/2008 |
| CN | 101387785 A | 3/2009 |
| CN | 102506393 A | 6/2012 |
| CN | 203413555 U | 1/2014 |
| CN | 103748369 A | 4/2014 |
| CN | 205488789 U | 8/2016 |
| CN | 107611656 A | 1/2018 |
| CN | 207338726 U | 5/2018 |
| JP | H07269549 A | 10/1995 |
| JP | 2008256967 A | 10/2008 |

OTHER PUBLICATIONS

International Search Report in corresponding PCT application No. PCT/CN2017/117328, dated May 29, 2018.
International Search Report in counterpart PCT application No. PCT/CN2018/109960, dated Jan. 11, 2019.
Written Opinion in corresponding PCT application No. PCT/CN2017/117328, dated May 29, 2018.
Written Opinion in counterpart PCT application No. PCT/CN2018/109960, dated Jan. 11, 2019.

* cited by examiner

CONNECTING STRUCTURE AND DISPLAY DEVICE

CROSS-REFERENCE TO RELATED APPLICATIONS

The present disclosure is a continuation of International Application No. PCT/CN2017/117328, filed on Dec. 20, 2017, which claims the benefits of and priority to Chinese Patent Application No. 201710948083.0, filed on Oct. 12, 2017. The disclosures of the aforementioned applications are hereby incorporated by reference in their entireties.

FIELD

The disclosure generally relates to the technical field of display, and more particularly relates to a connecting structure and a display device.

BACKGROUND

With the development of flat panel display technology, the flat panel display has made a great improvement on display effect. Compared to the traditional cathode ray tube screen, the flat panel display has the advantages of light weight, small volume, and low radiation, etc. Moreover, the cost of the flat panel display has also been reduced due to the improvement of the manufacture technology. As such, the flat panel display is popular among the consumers in the market. The flat panel display normally includes plasma display panel (PDP), liquid crystal display (LCD), and organic electroluminescence display (OELD), etc. The liquid crystal display has gradually become the mainstream in the market due to the advantages of improved image quality, short response time, lower cost, and longer service life.

However, mounting the modules of the liquid crystal display takes a great amount of manpower during the production process of the liquid crystal display. For example, the components of the liquid crystal display are commonly connected with each other through screws, thus is inconvenient to assemble or disassemble during the production or maintenance process, thereby bring the problem of time consumption and high production cost.

SUMMARY

The present disclosure provides a connecting structure with higher convenience and a display device.

One aspect, the exemplary embodiment of the present disclosure provides a connecting structure, which includes:

a connecting rod, which includes two ends, the connecting rod defines a guiding groove between the two ends;

a base, fixedly connected to one end of the connecting rod;

an elastic arm, fixedly connected to the other end of the connecting rod;

a clamping ring, sleeved on the elastic arm, the clamping ring defines a clamping component, the clamping component is received in the guiding groove, the clamping component moves in the guiding groove under an action of an external force, allowing the clamping ring to reciprocate along a direction of the guiding groove;

the clamping ring is capable of moving to generate a force on the elastic arm, allowing the elastic arm to deform elastically, and changing the opening and closing angle between the elastic arm and the connecting rod.

Another aspect, the exemplary embodiment of the present disclosure provides a connecting structure, which includes:

a connecting rod, including two ends, the connecting rod defining a guiding groove between the two ends;

a base, fixedly connected to one end of the connecting rod;

an elastic arm, fixedly connected to the other end of the connecting rod;

an elastic component, fixedly connected to the side surface of the base facing the elastic arm;

a clamping ring, sleeved on the elastic arm, the clamping ring defines a clamping component, the clamping component is received in the guiding groove, the clamping component moves in the guiding groove under an action of an external force, allowing the clamping ring to reciprocate along a direction of the guiding groove;

the clamping ring is capable of moving to generate a force on the elastic arm, allowing the elastic arm to deform elastically, and changing the opening and closing angle between the elastic arm and the connecting rod; the end of the guiding groove adjacent to the base defines a clamping groove, the clamping component is clamped in the clamping groove when the clamping component moves to the clamping groove, allowing the position of the clamping ring to remain unchanged.

Another aspect, the exemplary embodiment of the present disclosure provides a display device, which includes a display panel, a front frame, a backboard, and a connecting structure, the front frame connecting to the backboard through the connecting structure, the connecting structure includes:

a connecting rod, which includes two ends, the connecting rod defines a guiding groove between the two ends;

a base, fixedly connected to one end of the connecting rod;

an elastic arm, fixedly connected to the other end of the connecting rod;

an elastic component, fixedly connects to the side surface of the base facing the elastic arm;

a clamping ring, sleeved on the elastic arm, the clamping ring defines a clamping component, the clamping component is received in the guiding groove, the clamping component moves in the guiding groove under an action of an external force, allowing the clamping ring to reciprocate along a direction of the guiding groove;

the clamping ring is capable of moving to generate a force on the elastic arm, allowing the elastic arm to deform elastically, and changing the opening and closing angle between the elastic arm and the connecting rod; the end of the guiding groove adjacent to the base defines a clamping groove, the clamping component is clamped in the clamping groove when the clamping component moves to the clamping groove, allowing the position of the clamping ring to remain unchanged.

In the exemplary embodiment of the present disclosure, the clamping ring movably sleeved on the elastic arm can generate the force act on the elastic arm, to quickly change the opening and closing angle between the elastic arm and the connecting rod, therefore, the connecting structure can be quickly assembled and disassembled, thus greatly improving the working efficiency.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

DETAILED DESCRIPTION

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It should be understood that the terms used in this specification and claims such as "comprising" and "including" refer to the existence of the described characteristics, steps, operations, elements and/or components, without excluding one or more other characteristics, steps, operations, elements and/or components, or the existence or addition of their sets.

The description to each of the below exemplary embodiments refers to the figures, to illustrate the practical exemplary embodiments of the present disclosure. All directional indications in the present disclosure, e.g., "up", "down", "front", "back", "left", "right", "inside", "outside", "side surface", and so on, are only referred to the figures. Therefore, the directional indications are configured to explain and specific the present disclosure, and cannot be intended to limit the present application.

Figure 1:
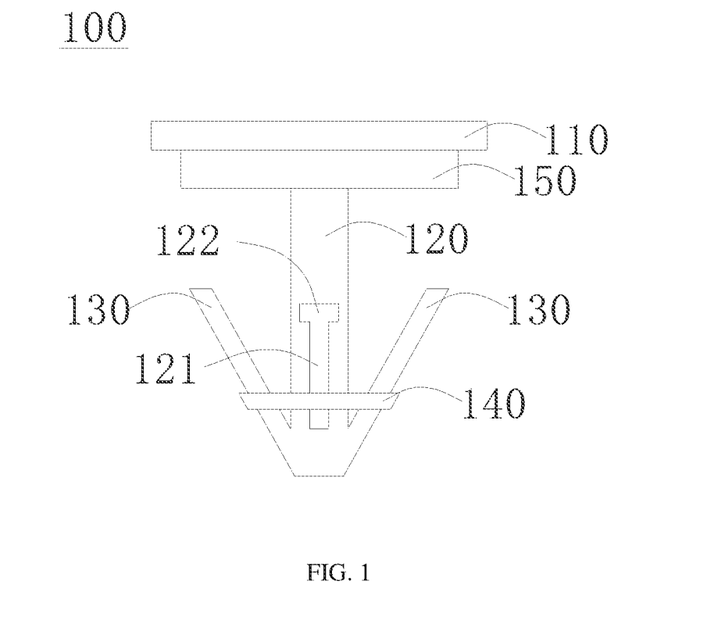
FIG. 1 is a side elevation diagram of the connecting structure of the present disclosure according to an exemplary embodiment.
Figure 2:
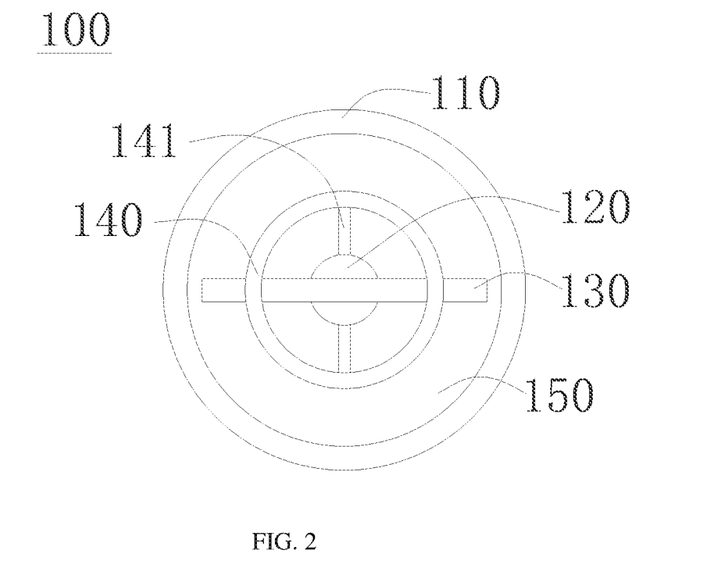
FIG. 2 is a bottom elevation diagram of the connecting structure of the present disclosure according to an exemplary embodiment.

Referring to FIGS. 1-2, which are a side elevation diagram and a bottom elevation diagram of the connecting structure of the present disclosure according to an exemplary embodiment respectively. In detail, the connecting structure 100 includes a base 110, a connecting rod 120, an elastic arm 130, and a clamping ring 140. The connecting structure 100 is configured to connect to a device to connect, the device to connect can includes a first component and a second component, the connecting structure 100 is configured to make the first component to fixedly connect with the second component. The first component and the second component both form a through hole, the connecting structure 100 can run through the through holes, the base 110 and the elastic arm 130 of the connecting structure 100 can generate a force for clamping the first component and the second component, as such the first component is fixedly connected with the second component. The first component can be a front frame of the display device, the second component can be a backboard in the display device.

The connecting rod 120 includes two ends, the connecting rod 120 defines a guiding groove 121 between the two ends.

The base 110 is fixedly connected to one end of the connecting rod 120.

The elastic arm 130 is fixedly connected to the other end of the connecting rod 120.

The clamping ring 140 is sleeved on the elastic arm 130. The clamping ring 140 defines a clamping component 141, the clamping component 141 is received in the guiding groove 121, the clamping component 141 moves in the guiding groove 121 under an action of an external force, allowing the clamping ring 140 to reciprocate along a direction of the guiding groove 121. The clamping ring 140 is capable of moving to generate a force act on the elastic arm 130, allowing the elastic arm 130 to deform elastically, and changing the opening and closing angle between the elastic arm 130 and the connecting rod 120.

In the detail exemplary embodiment, the guiding groove 121 is a non-through type guiding groove 121 or a through type guiding groove 121. The clamping ring 140 includes a clamping component 141, the clamping component 141 is fixedly connected with the clamping ring 140. If the guiding groove 121 is the through type guiding groove 121, the clamping component 141 runs through the guiding groove 121. The clamping component 141 runs through the guiding groove 121, for improving the connecting between the clamping component 141 and the guiding groove 121, so as to avoid the clamping component 121 from been escaped from the guiding groove 121, and the reliability of the connecting structure 100 is improved.

In exemplary embodiment, the base 110 has a plate structure which has a round shape. One end of the connecting rod 120 fixedly connects to the center portion of a surface of the base 110. The base 110 is connected with the connecting rod 120 through an integral molding mode. Furthermore, the connecting rod 120 is perpendicularly connected to the base 110. The contracting area of the base 110 and the device to connect can be increased through perpendicularly connecting the connecting rod 120 with the base 110, thereby improving the firmness of the connection.

In exemplary embodiment, the quantity of the elastic arm 130 is one or more than one. For example, the two elastic arms 130 are symmetrically connected with the connecting rod 120. Each of the elastic arms 130 includes two ends, one end connects with the connecting rod 120, the other end is configured to contract with the device to connect during the using process, to generate the clamping force act on the device to connect, and then the components of the device to connect are connected with each other. Furthermore, the end of the elastic arm 130 away from the connecting rod 120 defines an anti-skid layer, the anti-skid layer is an anti-skid mat made of rubber. The anti-skid layer is defined at the end of the elastic arm 130 away from the connecting rod 120, for improving the friction between the connecting structure 100 and the device to connect.

Furthermore, the end of the guiding groove 121 adjacent to the base 110 defines a clamping groove 122, the clamping component 141 is clamped in the clamping groove 122 when the clamping component 141 moves to the clamping groove 122, allowing the position of the clamping ring 140 to remain unchanged.

The guiding groove 121 and the clamping groove 122 both have an L shaped or T shaped cross section. The end of the guiding groove 121 adjacent to the base 110 defines the clamping groove 122, as such the clamping ring 140 can be fixed at the clamping groove 122, so as to maintain the opening and closing angle of the elastic arm 130 and the connecting rod 120 unchanged, which is beneficial to assemble and disassemble the connecting structure 100.

Figure 3:
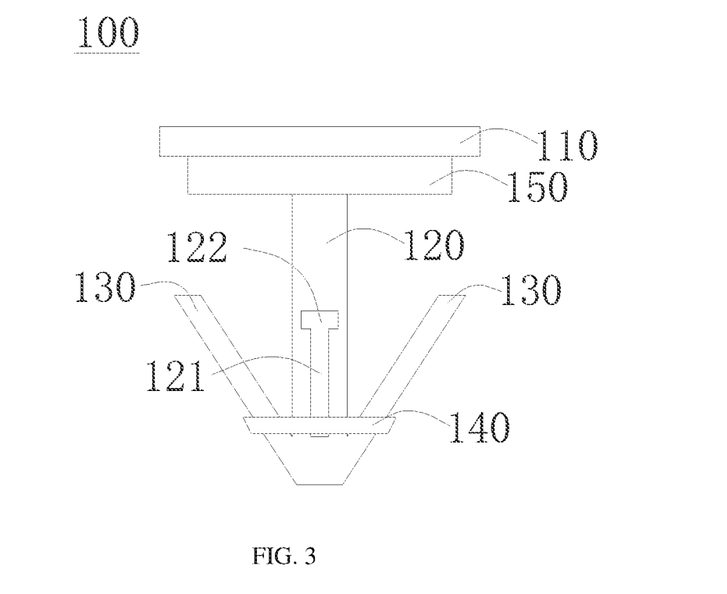
FIG. 3 is a side elevation diagram of the connecting structure of the present disclosure according to an exemplary embodiment.
Figure 4:
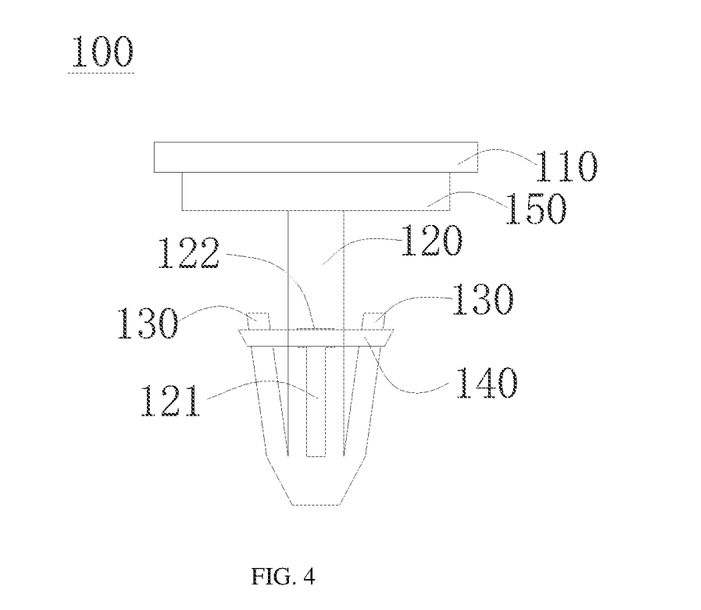
FIG. 4 is a side elevation diagram of the connecting structure of the present disclosure according to an exemplary embodiment.

Referring to FIGS. 3-4, which are both side elevation diagram of the connecting structure of the present disclosure according to an exemplary embodiment respectively. The clamping ring 140 and the elastic arm 130 may generate relative displacement, the clamping ring 120 can reciprocate along the guiding groove 121 under the action of the external force through the matching between the clamping component 141 and the guiding groove 121. During the moving process of the clamping ring 140, the clamping ring 140 would generate the force act on the elastic arm 130. When the position of the clamping ring 140 changes, the form of the connecting structure 100 changes accordingly.

In the detail exemplary embodiment, in the process of mounting the connecting structure 100, when the elastic arm 130 has not completely run through the through hole of the device to connect, the clamping ring 140 is subject to the force of the through hole of the device to connect. The clamping ring 140 moves towards the base 110 along the guiding groove 121 under the action of the force, the clamping ring 140 generates the force on the elastic arm 130, allowing the elastic arm 130 to deform elastically, and gradually changing the opening and closing angle between the elastic arm 130 and the connecting rod 120. When the clamping ring 140 moves to the clamping groove 122, the opening and closing angle has a minimum value. As such the connecting structure 100 can quickly pass through the through hole, to achieve the aim of quick installation.

When the elastic arm 130 absolutely runs through the through hole, the clamping ring 140 is subject to the force of the elastic arm 130, further driving the clamping ring 140 to move away from the base 110 along the guiding groove 121, as such the opening and closing angle of the elastic arm 130 and the connecting rod 120 gradually increases, until the clamping ring 140 moves to the end of the guiding groove 121 away from the clamping grove 122. At this time, the opening and closing angle of the elastic arm 130 and the connecting rod 120 has a maximum value, which is beneficial to quickly connect the connecting structure 100 with the device to connect.

In detail exemplary embodiment, during the process of disassembling the connecting structure 100, the clamping ring 140 can move towards the base 110 along the clamping groove 122 through the external force, at this time, the opening and closing angle of the elastic arm 130 and the connecting rod 120 gradually decreases. When the clamping ring 140 moves to the clamping groove 122, the opening and closing angle of the elastic arm 130 and the connecting rod 120 has the minimum value. The position of the clamping ring 140 maintains unchanged through the clamping relationship between the clamping component 141 and the clamping groove 122, further the opening and closing angle is also unchanged, to quickly assemble and disassemble.

Furthermore, the connecting structure 100 further includes an elastic component 150, the elastic component 150 fixedly connects to the side surface of the base 110 facing the elastic arm 130. In detail, the side surface of the base 110 facing the elastic arm 130 connects to the connecting rod 120. The elastic component 150 matches with the base 110 in shape, and the elastic component 150 has a plate structure which is elastic. For example, the elastic component 150 is conductive foam. Through setting the elastic component 150 on the base 110, the overall flexibility of the connecting structure 100 is improved, which is beneficial to the using of the connecting structure 100, and which can also prevent the device to connect from been damaged by the connecting structure 100.

Figure 5:
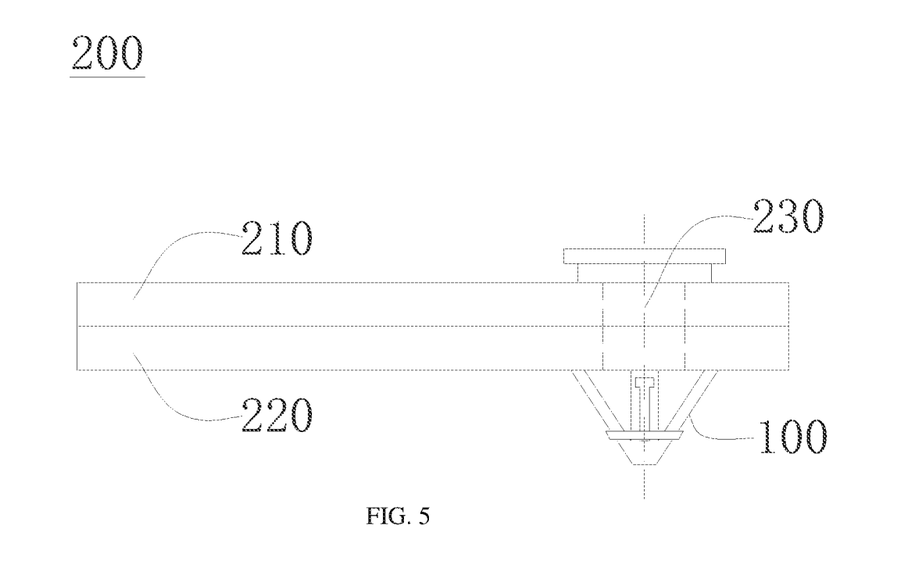
FIG. 5 is a structure diagram of the display device of the present disclosure according to an exemplary embodiment.
Figure 6:
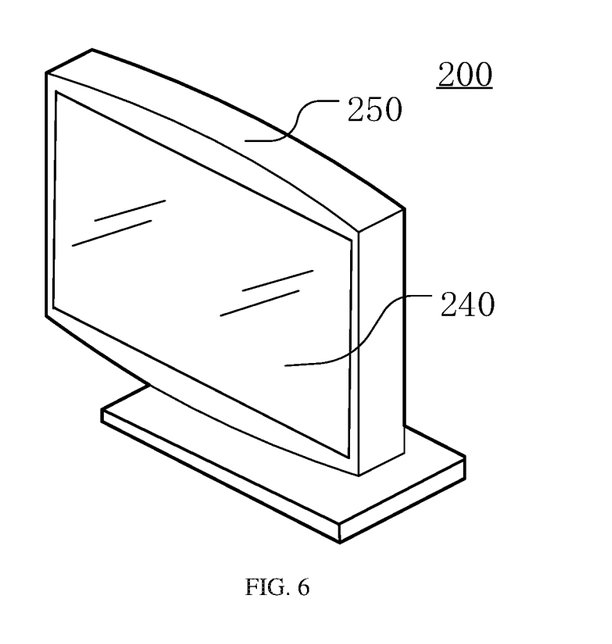
FIG. 6 is a structure diagram of the display device of the present disclosure according to an exemplary embodiment.

Referring to FIGS. 5-6, which are a structure diagram of the display device of the present disclosure according to an exemplary embodiment. The display device 200 includes a front frame 210, a backboard 220, and a connecting structure 100, the front frame 210 connects to the backboard 220 through the connecting structure 100. The display device 200 further includes a housing 250, and a display panel 240, the housing 250 is configured to fix the display panel 240, and configured to receive the connecting structure 100.

In detail, the display panel 240 includes, but not limit to, liquid crystal display (LCD), organic light-emitting diode (OLED), field emission display (FED), plasma display panel (PDP), curved panel. The liquid crystal panel includes thin film transistor-liquid crystal display (TFT-LCD) panel, twisted nematic (TN) film panel, vertical alignment (VA) type panel, in plane switching (IPS) panel, color filter on array (COA) panel, etc.

Referring to FIGS. 1-2, which are a side elevation diagram and a bottom elevation diagram of the connecting structure of the present disclosure according to an exemplary embodiment respectively. In detail, the connecting structure 100 includes a base 110, a connecting rod 120, an elastic arm 130, and a clamping ring 140. The connecting structure 100 is configured to connect to a device to connect, the device to connect can includes a first component and a second component, the connecting structure 100 is configured to make the first component to fixedly connect with the second component. The first component and the second component both form a through hole 230, the connecting structure 100 can run through the through holes 230, the base 110 and the elastic arm 130 of the connecting structure 100 can generate a force for clamping the first component and the second component, as such the first component is fixedly connected with the second component. The first component can be the front frame 210 of the display device 200, the second component can be the backboard 220 in the display device 200.

The connecting rod 120 includes two ends, the connecting rod 120 defines a guiding groove 121 between the two ends.

The base 110 is fixedly connected to one end of the connecting rod 120.

The elastic arm 130 is fixedly connected to the other end of the connecting rod 120.

The clamping ring 140 is sleeved on the elastic arm 130. The clamping ring 140 defines a clamping component 141, the clamping component 141 is received in the guiding groove 121, the clamping component 141 moves in the guiding groove 121 under an action of an external force, allowing the clamping ring 140 to reciprocate along a direction of the guiding groove 121. The clamping ring 140 is capable of moving to generate a force on the elastic arm 130, allowing the elastic arm 130 to deform elastically, and changing the opening and closing angle between the elastic arm 130 and the connecting rod 120.

Furthermore, the front frame 210 and the backboard both 220 define a through hole 230, the two through holes 230 are same size, the connecting structure 100 is defined in the through holes and runs through the through holes 230; the clamping component 141 is clamped in the clamping groove 122 when the clamping component 141 moves to the clamping groove 122, a diameter of the through hole 230 is greater than the maximum external diameter of the clamping ring 140; if the clamping component 141 is not located in the clamping groove 122, the maximum external diameter formed by the elastic arm 130 taking the connecting rod 120 as the center is greater than the diameter of the through hole 230.

In the detail exemplary embodiment, the guiding groove 121 is a non-through type guiding groove 121 or a through type guiding groove 121. The clamping ring 140 includes the clamping component 141, the clamping component 141 is fixedly connected with the clamping ring 140. If the guiding groove 121 is the through type guiding groove 121, the clamping component 141 runs through the guiding groove 121. The clamping component 141 runs through the guiding groove 121, for improving the connecting between the clamping component 141 and the guiding groove 121, so as to avoid the clamping component 121 from been escaped from the guiding groove 121, and the reliability of the connecting structure 100 is improved.

In exemplary embodiment, the base 110 has a plate structure which has a round shape. One end of the connecting rod 120 fixedly connects to the center portion of a surface of the base 110. The base 110 is connected with the connecting rod 120 through an integral molding mode. Furthermore, the connecting rod 120 is perpendicularly connected to the base 110. The contracting area of the base 110 and the device to connect can be increased through perpendicularly connecting the connecting rod 120 with the base 110, thereby improving the firmness of the connection.

In exemplary embodiment, the quantity of the elastic arm 130 is one or more than one. For example, the two elastic arms 130 are symmetrically connected with the connecting rod 120. Each of the elastic arms 130 includes two ends, one end connects with the connecting rod 120, the other end is configured to contract with the device to connect during the using process, to generate the clamping force act on the device to connect, and then the components of the device to connect are connected with each other. Furthermore, the end of the elastic arm 130 away from the connecting rod 120 defines an anti-skid layer, the anti-skid layer is an anti-skid mat made of rubber. The anti-skid layer defined at the end of the elastic arm 130 away from the connecting rod 120, for improving the friction between the connecting structure 100 and the device to connect.

Furthermore, the end of the guiding groove 121 adjacent to the base 110 defines a clamping groove 122, the clamping component 141 is clamped in the clamping groove 122 when the clamping component 141 moves to the clamping groove 122, allowing the position of the clamping ring 140 to remain unchanged.

The guiding groove 121 and the clamping groove 122 both have an L shaped or T shaped cross section. The end of the guiding groove 121 adjacent to the base 110 defines the clamping groove 122, as such the clamping ring 140 can be fixed in the clamping groove 122, so as to maintain the opening and closing angle of the elastic arm 130 and the connecting rod 120 unchanged, which is beneficial to assemble and disassemble the connecting structure 100.

Referring to FIGS. 3-4, which are both the side elevation diagram of the connecting structure of the present disclosure according to an exemplary embodiment. The clamping ring 140 and the elastic arm 130 may generate relative displacement, the clamping ring 120 can reciprocate along the guiding groove 121 under the action of the external force through the matching between the clamping component 141 and the guiding groove 121. During the moving process of the clamping ring 140, the clamping ring 140 would generate the force act on the elastic arm 130. When the position of the clamping ring 140 changes, the form of the connecting structure 100 changes accordingly.

In the detail exemplary embodiment, in the process of mounting the connecting structure 100, when the elastic arm 130 has not completely run through the through hole 230 of the device to connect, the clamping ring 140 is subject to the force of the through hole 230 of the device to connect. The clamping ring 140 moves towards the base 110 along the guiding groove 121 under the action of the force, the clamping ring 140 generates the force on the elastic arm 130, allowing the elastic arm 130 to deform elastically, as such the opening and closing angle between the elastic arm 130 and the connecting rod 120 gradually decreases. When the clamping ring 140 moves to the clamping groove 122, the opening and closing angle has a minimum value. As such the connecting structure 100 can quickly pass through the through hole 230, to achieve the aim of quick installation.

When the elastic arm 130 absolutely runs through the through hole 230, the clamping ring 140 is subject to the force of the elastic arm 130, further driving the clamping ring 140 to move away from the base 110 along the guiding groove 121, as such the opening and closing angle of the elastic arm 130 and the connecting rod 120 gradually increases, until the clamping ring 140 moves to the end of the guiding groove 121 away from the clamping grove 122. At this time, the opening and closing angle of the elastic arm 130 and the connecting rod 120 has a maximum value, which is beneficial to quickly connect the connecting structure 100 with the device to connect.

In detail exemplary embodiment, during the process of disassembling the connecting structure 100, the clamping ring 140 can move towards the base 110 along the clamping groove 122 through the external force, at this time, the opening and closing angle of the elastic arm 130 and the connecting rod 120 gradually decreases. When the clamping ring 140 moves to the clamping groove 122, the opening and closing angle of the elastic arm 130 and the connecting rod 120 has a minimum value. The position of the clamping ring 140 maintains unchanged through the clamping relationship between the clamping component 141 and the clamping groove 122, further the opening and closing angle is also unchanged, to quickly assemble and disassemble.

Furthermore, the connecting structure 100 further includes an elastic component 150, the elastic component 150 fixedly connects to the side surface of the base 110 facing the elastic arm 130. In detail, the side surface of the base 110 facing the elastic arm 130 connects to the connecting rod 120. The elastic component 150 matches with the base 110 in shape, and the elastic component 150 has a plate structure which is elastic. For example, the elastic component 150 is conductive foam. Through setting the elastic component 150 on the base 110, the overall flexibility of the connecting structure 100 is improved, which is beneficial to the using of the connecting structure 100, and which can also prevent the device to connect from been damaged by the connecting structure 100.

It is to be understood that, in the above exemplary embodiments, the above exemplary embodiments have different emphases. Any missing details in one exemplary embodiment may be found in the related description of the other exemplary embodiments.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A connecting structure, comprising:
a connecting rod, comprising two ends, the connecting rod defining a guiding groove between the two ends;
a base, fixedly connected to one end of the connecting rod;
an elastic arm, fixedly connected to the other end of the connecting rod; and
a clamping ring, sleeved on the elastic arm, the clamping ring defining a clamping component, the clamping component being received in the guiding groove, the clamping component moving in the guiding groove under an action of an external force, allowing the clamping ring to reciprocate along a direction of the guiding groove,
wherein, the clamping ring is capable of moving to generate a force on the elastic arm, allowing the elastic arm to deform elastically, and changing an opening and closing angle between the elastic arm and the connecting rod;
wherein, the connecting structure further comprises an elastic component, the elastic component fixedly connects to a side surface of the base facing the elastic arm.

2. The connecting structure according to claim 1, wherein, an end of the guiding groove adjacent to the base defines a clamping groove, the clamping component is clamped in the clamping groove when the clamping component moves to the clamping groove, allowing the position of the clamping ring to remain unchanged.

3. The connecting structure according to claim 1, wherein, the elastic component is conductive foam.

4. The connecting structure according to claim 1, wherein, the guiding groove has an L shaped cross section.

5. The connecting structure according to claim 1, wherein, the guiding groove has a T shaped cross section.

6. The connecting structure according to claim 1, wherein, the connecting rod is perpendicularly connected to the base.

7. The connecting structure according to claim 1, wherein, the connecting rod is integrated with the base.

8. The connecting structure according to claim 1, wherein, a quantity of the elastic arm is one or more than one.

9. The connecting structure according to claim 8, wherein, the quantity of the elastic arm is two.

10. The connecting structure according to claim 9, wherein, the two elastic arms are symmetrically connected with the connecting rod.

11. The connecting structure according to claim 1, wherein, the elastic arm defines an anti-skid layer.

12. The connecting structure according to claim 11, wherein, the anti-skid layer is an anti-skid mat made of rubber.

13. The connecting structure according to claim 1, wherein, the guiding groove is a non-through type guiding groove or a through type guiding groove.

14. The connecting structure according to claim 13, wherein, if the guiding groove is the through type guiding groove, the clamping component runs through the guiding groove.

15. The connecting structure according to claim 1, wherein, if the clamping ring moves towards the base along the guiding groove, the opening and closing angle between the elastic arm and the connecting rod gradually decreases.

16. The connecting structure according to claim 1, wherein, if the clamping ring moves away from the base along the guiding groove, the opening and closing angle between the elastic arm and the connecting rod gradually increases.

17. A connecting structure, comprising:
a connecting rod, which comprising two ends, the connecting rod defining a guiding groove between the two ends;
a base, fixedly connected to one end of the connecting rod, the base being perpendicular to the connecting rod;
an elastic arm, fixedly connected to the other end of the connecting rod;
an elastic component, fixedly connects to the side surface of the base facing the elastic arm; and
a clamping ring, sleeved on the elastic arm, the clamping ring defining a clamping component, the clamping component being received in the guiding groove, the clamping component moving in the guiding groove under an action of an external force, allowing the clamping ring to reciprocate along a direction of the guiding groove,
wherein, the clamping ring is capable of moving to generate a force on the elastic arm, allowing the elastic arm to deform elastically, and changing the opening and closing angle between the elastic arm and the connecting rod; the end of the guiding groove adjacent to the base defines a clamping groove, the clamping component is clamped in the clamping groove when the clamping component moves to the clamping groove, allowing the position of the clamping ring to remain unchanged.

18. A display device, comprising a display panel, a front frame, a backboard, and a connecting structure, the front frame connecting to the backboard through the connecting structure, wherein, the connecting structure comprises:
a connecting rod, which comprises two ends, the connecting rod defines a guiding groove between the two ends;
a base, fixedly connected to one end of the connecting rod;
an elastic arm, fixedly connected to the other end of the connecting rod;
an elastic component, fixedly connected to the side surface of the base facing the elastic arm; and
a clamping ring, sleeved on the elastic arm, the clamping ring defines a clamping component, the clamping component is received in the guiding groove, the clamping component moves in the guiding groove under an action of an external force, allowing the clamping ring to reciprocate along a direction of the guiding groove,
wherein, the clamping ring is capable of moving to generate a force on the elastic arm, allowing the elastic arm to deform elastically, and changing the opening and closing angle between the elastic arm and the connecting rod; the end of the guiding groove adjacent to the base defines a clamping groove, the clamping component is clamped in the clamping groove when the clamping component moves to the clamping groove, allowing the position of the clamping ring to remain unchanged.

19. The display device according to claim 18, wherein, the front frame and the backboard both define a through hole, the two through holes are same size, the connecting structure is defined in the through holes and runs through the through holes; the clamping component is clamped in the clamping groove when the clamping component moves to the clamping groove, a diameter of the through hole is greater than the maximum external diameter of the clamping ring; if the clamping component is not located in the clamping groove, the maximum external diameter formed by the elastic arm taking the connecting rod as the center is greater than the diameter of the through hole.

* * * * *